United States Patent
Han

(10) Patent No.: US 8,994,709 B2
(45) Date of Patent: Mar. 31, 2015

(54) ORGANIC LIGHT EMITTING DISPLAY AND METHOD OF MANUFACTURING THE SAME

(75) Inventor: Sam-Il Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 686 days.

(21) Appl. No.: 12/851,540

(22) Filed: Aug. 5, 2010

(65) Prior Publication Data

US 2011/0102402 A1 May 5, 2011

(30) Foreign Application Priority Data

Nov. 4, 2009 (KR) .................. 10-2009-0105987

(51) Int. Cl.
*G06F 3/038* (2013.01)
*H01L 21/00* (2006.01)
*H01L 27/32* (2006.01)
*G09G 3/32* (2006.01)

(52) U.S. Cl.
CPC .......... *H01L 27/3279* (2013.01); *G09G 3/3233* (2013.01); *G09G 2300/0842* (2013.01); *G09G 2300/0861* (2013.01)
USPC ................ 345/211; 345/76; 438/34

(58) Field of Classification Search
CPC ............ H01L 27/3279; G09G 2300/0842
USPC ............ 345/211, 76, 80; 257/99, 59; 365/51; 438/34
See application file for complete search history.

(56) References Cited

U.S. PATENT DOCUMENTS

| | | | | |
|---|---|---|---|---|
| 2005/0243032 A1* | 11/2005 | Lee | ................ | 345/76 |
| 2006/0132055 A1 | 6/2006 | Kwak | | |
| 2007/0035485 A1* | 2/2007 | Yoon | ................ | 345/76 |
| 2008/0036704 A1* | 2/2008 | Kim et al. | ................ | 345/76 |
| 2009/0225579 A1* | 9/2009 | Shepard et al. | ................ | 365/51 |
| 2009/0262051 A1* | 10/2009 | Kim et al. | ................ | 345/80 |

FOREIGN PATENT DOCUMENTS

| | | |
|---|---|---|
| JP | 2003-108068 | 4/2003 |
| JP | 2006-011095 | 1/2006 |
| KR | 1020010014501 A | 2/2001 |
| KR | 1020060065083 A | 6/2006 |
| KR | 10-0698697 | 3/2007 |

OTHER PUBLICATIONS

Korean Office action dated Oct. 4, 2011 issued in Korean Priority Application No. 10-2009-0105987, 1 page.

* cited by examiner

*Primary Examiner* — Kumar Patel
*Assistant Examiner* — Kuo Woo
(74) *Attorney, Agent, or Firm* — Christie, Parker & Hale, LLP

(57) ABSTRACT

An organic light emitting display and a method of manufacturing the organic light emitting display are provided. The organic light emitting display includes a display unit including pixels coupled to scan lines, data lines, emission control lines, and power lines, a scan driver on a side of the display unit and coupled to the scan lines, an emission control driver on another side of the display unit and coupled to the emission control lines, a first power pad on a side of one of the scan driver or the emission control driver for receiving power, a second power pad on another side of the one of the scan driver or the emission control driver, the second power pad coupled to the power lines, and power buses coupling the first power pad and the second power pad to each other.

7 Claims, 3 Drawing Sheets

ORGANIC LIGHT EMITTING DISPLAY AND METHOD OF MANUFACTURING THE SAME

CROSS-REFERENCE TO RELATED APPLICATION

This application claims priority to and the benefit of Korean Patent Application No. 10-2009-0105987, filed on Nov. 4, 2009, in the Korean Intellectual Property Office, the entire content of which is incorporated herein by reference.

BACKGROUND

1. Field

Aspects of embodiments of the present invention relate to an organic light emitting display and a method of manufacturing the same.

2. Description of the Related Art

Various flat panel displays (FPDs) with reduced weight and volume in comparison to cathode ray tubes (CRTs) are being developed. The FPDs include a liquid crystal display (LCD), a field emission display (FED), a plasma display panel (PDP), and an organic light emitting display.

The organic light emitting display displays an image using organic light emitting diodes (OLEDs) that generate light by re-combination of electrons and holes.

The organic light emitting display is widely used in devices such as personal digital assistants (PDAs), MP3 players, and mobile telephones due to various advantages such as excellent color reproducibility and small thickness.

The OLED included in the organic light emitting display includes an anode electrode, a cathode electrode, and a light emitting layer formed between the anode electrode and the cathode electrode. In the OLED, the light emitting layer emits light when current flows from the anode electrode to the cathode electrode, and the amount of emitted light varies in accordance with a change in the amount of current supplied the OLED to display brightness.

SUMMARY

Accordingly, aspects of embodiments of the present invention relate to an organic light emitting display in which the voltage drop of a pixel power line is reduced regardless of the shape of a display unit to reduce brightness non-uniformity between pixels and to improve picture quality, and a method of manufacturing the same.

Aspects of embodiments of the present invention also relate to an organic light emitting display in which a pixel power line is formed in a mesh type to reduce a difference in the voltage of the pixel power applied to a pixel and a method of manufacturing the same.

According to a first embodiment of the present invention, there is provided an organic light emitting display including a display unit including pixels coupled to scan lines, data lines, emission control lines, and power lines, a scan driver on a side of the display unit and coupled to the scan lines, an emission control driver on another side of the display unit and coupled to the emission control lines, a first power pad on a side of one of the scan driver or the emission control driver for receiving power, a second power pad on another side of the one of the scan driver or the emission control driver, the second power pad coupled to the power lines, and power buses coupling the first power pad and the second power pad to each other so that the first power pad and the second power pad are not coupled to the scan driver or the emission control driver.

According to a second embodiment of the present invention, there is provided a method of manufacturing an organic light emitting display including a display unit including data lines, scan lines, emission control lines, power lines, and a plurality of transistors and capacitors. The method includes forming an active layer on a transparent substrate to form a channel region of a transistor of the transistors and a first electrode of a capacitor of the capacitors, depositing and patterning a gate metal to form a gate electrode of the transistor, the scan lines, the emission control lines, and a second electrode of the capacitor, and depositing and patterning a source drain metal to form data lines and main power lines and sub power lines formed in a mesh so that one of the main power lines or one of the sub power lines is coupled to the second electrode of the capacitor through a contact hole.

The source drain metal may have a resistance lower than that of the gate metal.

In the organic light emitting display and the method of manufacturing the same, according to the embodiments of the present invention, a metal having low resistance may be used as the pixel power line regardless of the shape of the display unit so that the voltage drop of the pixel power may be reduced. In addition, the pixel power lines are formed in the mesh type so that the magnitude of the voltage drop may be reduced.

BRIEF DESCRIPTION OF THE DRAWINGS

The accompanying drawings, together with the specification, illustrate exemplary embodiments of the present invention, and, together with the description, serve to explain the principles of embodiments of the present invention.

DETAILED DESCRIPTION

Figure 1:
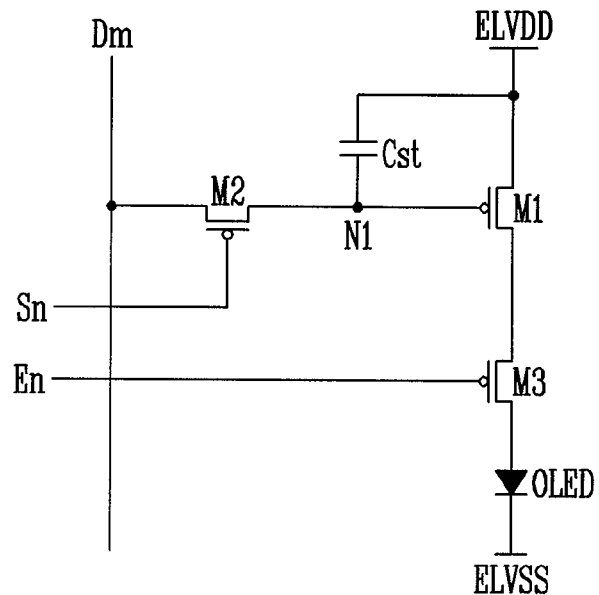
FIG. 1 is a circuit diagram illustrating a pixel of a typical organic light emitting display.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on another element or be indirectly on another element with one or more intervening elements interposed therebetween. Also, when an element is referred to as being "connected to" or "coupled to" another element, it can be directly connected to another element or be indirectly connected to another element with one or more intervening elements interposed therebetween. Hereinafter, like reference numerals refer to like elements.

FIG. 1 is a circuit diagram illustrating a pixel of a typical organic light emitting display. Referring to FIG. 1, the pixel is coupled to a data line Dm, a scan line Sn, an emission control line En, and a pixel power line ELVDD and includes a first transistor M1, a second transistor M2, a third transistor M3, a capacitor Cst, and an OLED.

The source of the first transistor M1 is coupled to the pixel power line ELVDD, the drain of the first transistor M1 is coupled to the source of the third transistor M3, and the gate of the first transistor M1 is coupled to a first node N1. The source of the second transistor M2 is coupled to the data line Dm, the drain of the second transistor M2 is coupled to the first node N1, and the gate of the second transistor M2 is coupled to the scan line Sn. The source of the third transistor M3 is coupled to the drain of the first transistor M1, the drain of the third transistor M3 is coupled to the OLED, and the gate of the third transistor M3 is coupled to the emission control line En. The capacitor Cst is coupled between the first node N1 and the pixel power line ELVDD to maintain a voltage between the first node N1 and the pixel power line ELVDD for a set time. The OLED includes an anode electrode, a cathode electrode, and a light emitting layer. The anode electrode of the OLED is coupled to the drain of the third transistor M3, and the cathode electrode of the OLED is coupled to a low potential power source ELVSS so that, when current flows from the anode electrode to the cathode electrode, the light emitting layer emits light. Therefore, brightness is controlled to correspond to the amount of current.

Here, when the voltage of a pixel power source varies in accordance with the position of a pixel, a difference in the amount of current that flows to the OLED is generated so that brightness becomes non-uniform among the pixels.

A method of forming the pixel power line ELVDD in a mesh type in order to reduce voltage drop in the pixel power line ELVDD is disclosed in the Korean Patent with Registration No. 0698697. When the pixel power line ELVDD is the mesh type, the pixel power line ELVDD is divided into a main pixel power line ELVDD and an auxiliary pixel power line ELVDD. The main pixel power line ELVDD is directly coupled to a power source pad receiving a pixel power from a power source supply unit and supplying the pixel power to the pixel power line ELVDD to supply the pixel power to a pixel. The auxiliary pixel power line ELVDD is electrically coupled to the main pixel power line ELVDD to reduce the voltage drop of the pixel power. Typically, a low resistance source drain metal (e.g., a metal for forming source/drain electrodes of a transistor) is used as the main pixel power line ELVDD and a gate metal (e.g., a metal for forming gate electrode of a transistor) having larger resistance than the resistance of the source drain metal is used as the auxiliary pixel power line ELVDD.

Therefore, since the voltage drop of the auxiliary pixel power line ELVDD is larger than that of the main pixel power line ELVDD for supplying the pixel power, even though the pixel power line ELVDD is the mesh type, the voltage drop generated by the pixel power line ELVDD is not significantly reduced.

Hereinafter, embodiments of the present invention will be described with reference to the accompanying drawings.

Figure 2A:
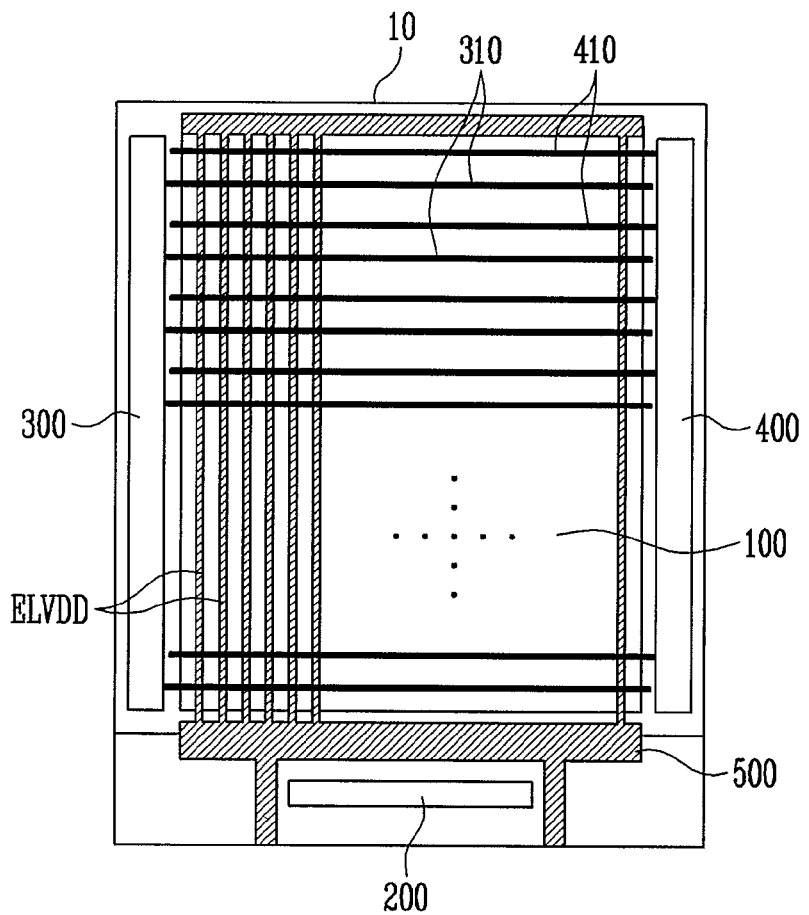
FIG. 2A is a block diagram illustrating a first typical organic light emitting display.
Figure 2B:
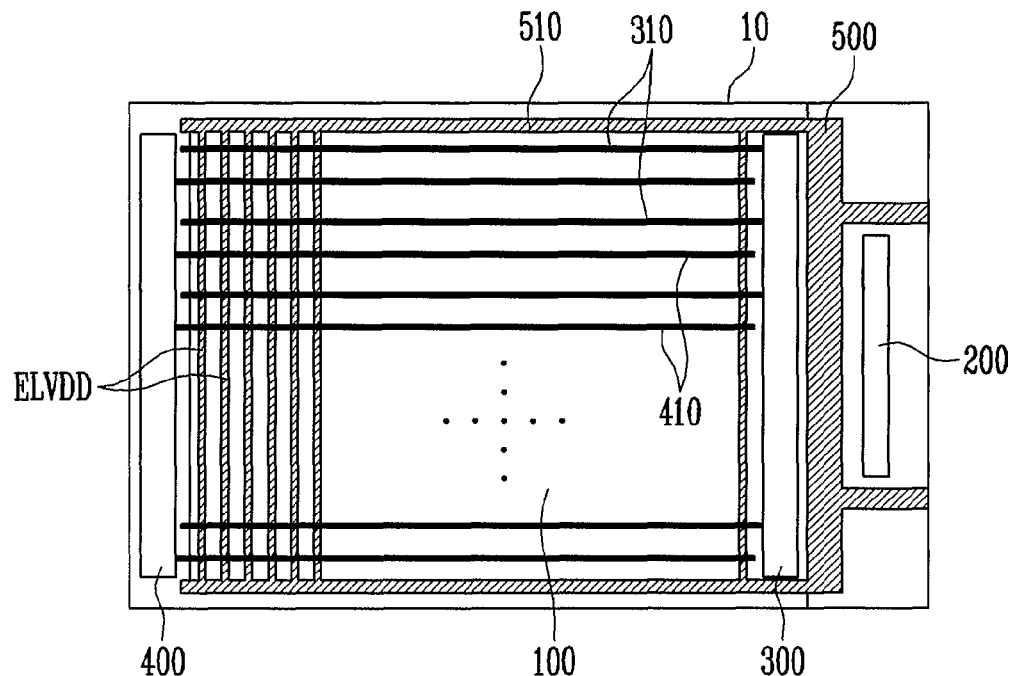
FIG. 2B is a block diagram illustrating a second typical organic light emitting display.

FIG. 2A is a block diagram illustrating a first typical organic light emitting display. FIG. 2B is a block diagram illustrating a second typical organic light emitting display. FIG. 2A illustrates an organic light emitting display in which horizontal length is less than vertical length. FIG. 2B illustrates an organic light emitting display in which the horizontal length is larger than the vertical length.

First, referring to FIG. 2A, a display unit 100 is formed on a substrate 10, and a scan driver 300 and an emission control driver 400 are formed on the left and right sides of the display unit 100, respectively. A pixel power pad 500 for transmitting a pixel power to a data driver 200 and the display unit 100 is formed on a side (e.g., underside) of the display unit 100.

In the display unit 100, a plurality of scan lines 310 and a plurality of emission control lines 410 extend in a horizontal direction, and a plurality of data lines and a plurality of pixel power lines ELVDD extend in a vertical direction. Here, pixels are formed in the regions defined by the scan lines 310, the data lines, the emission control lines 410, and the pixel power lines ELVDD.

The scan driver 300 and the emission control driver 400 are respectively coupled to the scan lines 310 and the emission control lines 410 and generate scan signals and emission control signals, respectively, to be transmitted to the pixels through the scan lines 310 and the emission control lines 410.

The data driver 200 is coupled to the data lines and generates data signals so that the data signals are transmitted to the pixels through the data lines.

The pixel power pad 500 is coupled to the pixel power lines ELVDD to receive a pixel power from the outside and to transmit the received pixel power to the pixel power lines ELVDD.

Referring to FIG. 2B, the display unit 100 is formed on a substrate 10, and the scan driver 300 and the emission control driver 400 are formed on the right and left sides, respectively, of the display unit 100. The pixel power pad 500 for transmitting the pixel power to the data driver 200 and the display unit 100 is formed on a side (e.g., right side) of the display unit 100. In addition, power source buses 510 coupled to the pixel power pad 500 are formed in the upper and lower portions of the display unit 100, respectively.

In the organic light emitting display illustrated in FIG. 2B, like in the organic light emitting display illustrated in FIG. 2A, in the display unit 100, the plurality of scan lines 310 and the plurality of emission control lines 410 extend in a horizontal direction, and the plurality of data lines and the plurality of pixel power lines ELVDD extend in a vertical direction. Pixels are formed at the regions defined by the scan lines 310, the data lines, the emission control lines 410, and the pixel power lines ELVDD.

In FIG. 2B, the pixel power lines ELVDD are not directly coupled to the pixel power pad 500, and the pixel power is transmitted to the pixel power lines ELVDD using the power source buses 510 positioned in the upper and lower portions of the display unit 100. Here, in FIG. 2B, since the length of the power source buses 510 is long, a brightness difference is generated between a pixel that is remote from the pixel power pad 500 and a pixel that is close to the pixel power pad 500 due to the voltage drop along the power source buses 510 so that picture quality deteriorates due to such a voltage difference.

Figure 3:
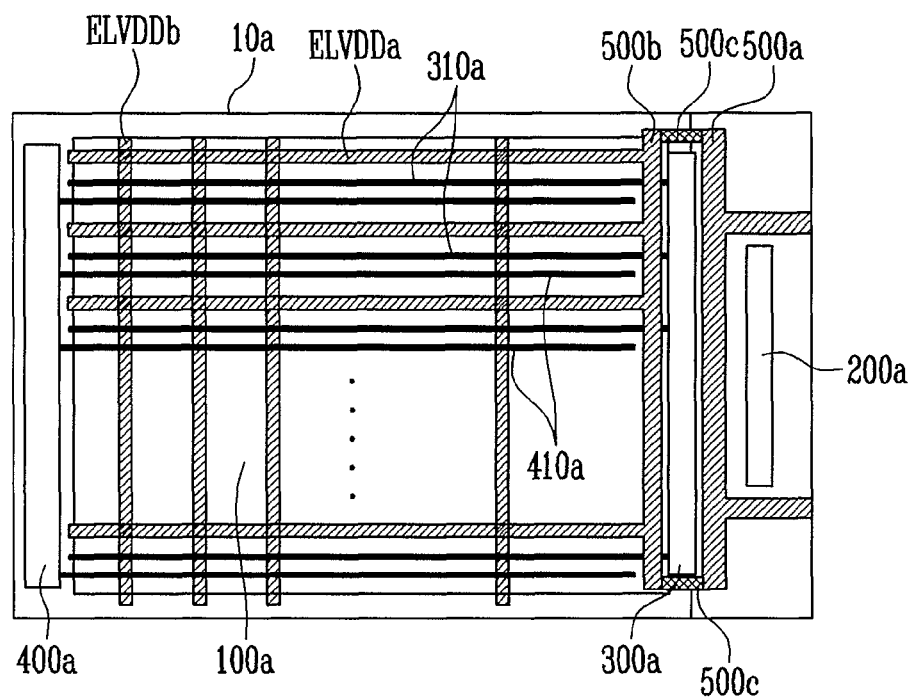
FIG. 3 is a block diagram illustrating the structure of an organic light emitting display according to an embodiment of the present invention.

FIG. 3 is a block diagram illustrating a structure of an organic light emitting display according to one embodiment of the present invention. Referring to FIG. 3, a display unit 100a is formed on a substrate 10a, and a scan driver 300a and an emission control driver 400a are respectively formed on the left and right sides of the display unit 100a. A first pixel power pad 500a and a second pixel power pad 500b for transmitting the pixel power to a data driver 200a and the display unit 100a are formed on a side (e.g., right side) of the display unit 100a. In addition, the first pixel power pad 500a and the second pixel power pad 500b are coupled to each other through power source buses 500c.

In the display unit 100a, a plurality of scan lines 310a and a plurality of emission control lines 410a extend in a horizontal direction, and a plurality of data lines 210a extend in a vertical direction. In addition, a plurality of pixel power lines ELVDDa extend in the horizontal direction. Pixels (e.g., shown in FIG. 4) are formed at the regions defined by the scan lines 310a, the data lines, the emission control lines 410a, and the pixel power lines ELVDDa.

The scan driver 300a and the emission control driver 400a are respectively formed on first and second sides (e.g., right and left sides) of the display unit 100a and are coupled to the scan lines 310a and the emission control lines 410a, respectively, to supply a scan signal through the scan lines 310a and to supply an emission control signal through the emission control lines 410a.

The data driver 200a is coupled to the data lines 210a and generates data signals that are transmitted to the pixels through the data lines.

The first pixel power pad 500a and the second pixel power pad 500b are positioned on the right and left sides of the scan driver 300a to receive the pixel power from the outside. The second pixel power pad 500b is positioned on the left side of the scan driver 300a to be coupled to the plurality of pixel power lines ELVDDa. Here, since the second pixel power pad 500b is directly coupled to the pixel power lines ELVDDa, as illustrated in FIG. 3, the pixel power is uniformly transmitted to the pixel power lines ELVDDa to reduce the deterioration of picture quality.

In FIG. 3, it is illustrated that the first pixel power pad 500a and the second pixel power pad 500b are respectively positioned on first and second sides (e.g., right and left sides) of the scan driver 300a. However, in other embodiments, the first pixel power pad 500a and the second pixel power pad 500b may be respectively positioned on first and second sides (e.g., left and right sides) of the emission control driver 400a.

Figure 4:
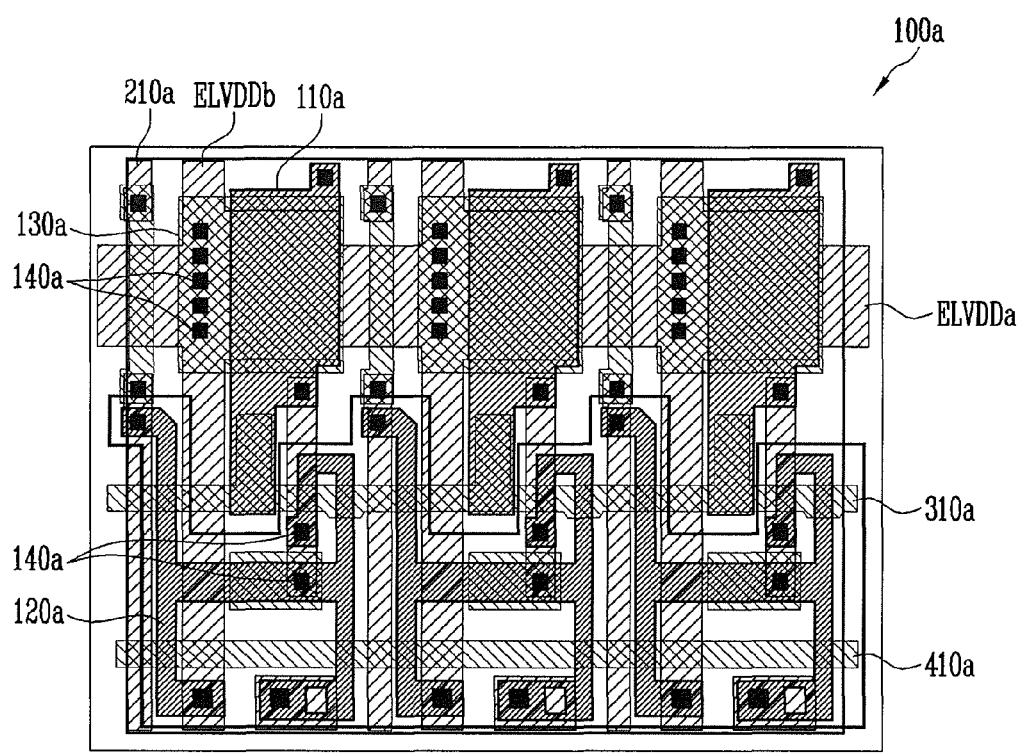
FIG. 4 is a layout diagram of a display unit of FIG. 3.

FIG. 4 is a layout diagram of the display unit of FIG. 3. Referring to FIG. 4, first, an active layer made of polysilicon is deposited on a transparent substrate, and the active layer is patterned. A first electrode 110a of a capacitor and a channel region 120a of a transistor are formed by the active layer.

Then, an insulating layer is formed on the first electrode 110a and the channel region 120a, and a gate metal is deposited and patterned. Therefore, a second electrode 130a of the capacitor, the scan line 310a, and the emission control line 410a are made of the gate metal. Then, after forming an insulating layer on the second electrode 130a, the scan line 310a, and the emission control line 410a, contact holes 140a formed, and then, a source drain metal is deposited to be patterned. The data line, the main pixel power line ELVDDa, and the sub-pixel power line ELVDDb are made of the source drain metal. Here, the main pixel power line ELVDDa is formed on the second electrode 130a of the capacitor to run in parallel with the scan line 310a, and the sub-pixel power line ELVDDb is formed to run in parallel with the data line 210a. In addition, the source drain metal of a transistor contacts the channel region 120a of the transistor by the contact hole 140a to form the source electrode and the drain electrode of the transistor, and the pixel power lines ELVDDa and ELVDDb and the second electrode 130a of the capacitor are coupled to each other so that the pixel power may be supplied to the second electrode 130a of the capacitor.

Therefore, the main pixel power line ELVDDa and the sub-pixel power line ELVDDb are made of the source drain metal having low resistance so that the voltage drop of the pixel power is small regardless of the position of the pixel power pad.

When the display unit 100 is formed as illustrated in FIG. 2A, the power lines ELVDD are coupled to the pixel power pad 500 to receive the pixel power. When the display unit 100a is formed as illustrated in FIG. 3, the main pixel power lines ELVDDa are coupled to the second pixel power source pad 500b to receive the pixel power.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   a display unit comprising pixels coupled to scan lines, data lines, emission control lines, and power lines;
   a scan driver on a side of the display unit and coupled to the scan lines;
   an emission control driver on another side of the display unit and coupled to the emission control lines;
   a first power pad on a side of one of the scan driver or the emission control driver for receiving power;
   a second power pad on another side of the one of the scan driver or the emission control driver, the second power pad being directly coupled to the power lines; and
   power buses for coupling the first power pad and the second power pad to each other,
   wherein a first one of the power buses connects a first end of the first power pad to a first end of the second power pad, and a second one of the power buses connects a second end of the first power pad to a second end of the second power pad such that the first power pad, the second power pad, and the power buses surround the one of the scan driver or the emission control driver,
   wherein the power buses are in an upper portion and a lower portion of the display unit, and
   wherein the first power pad and the second power pad are not coupled to the scan driver or the emission control driver.

2. The organic light emitting display as claimed in claim 1, wherein the power lines comprise a main power line and a sub power line, and
   wherein the main power line and the sub power line are arranged in a mesh.

3. The organic light emitting display as claimed in claim 2, wherein the main power line is coupled to the second power pad.

4. The organic light emitting display as claimed in claim 2, wherein the sub power line is coupled to the second power pad.

5. The organic light emitting display as claimed in claim 4, wherein each of the pixels comprises:
   an organic light emitting diode (OLED) for emitting light to correspond to the amount of a driving current;
   a first transistor for generating the driving current in response to a data signal;
   a second transistor for selectively transmitting the data signal to the first transistor;
   a third transistor for selectively supplying the driving current to the OLED; and
   a capacitor for storing a voltage of the data signal transmitted to the first transistor.

6. The organic light emitting display as claimed in claim 5, wherein a first electrode of the capacitor comprises a silicon layer and a second electrode of the capacitor comprises a gate metal for forming a gate of at least one of the first transistor, the second transistor, or the third transistor.

7. The organic light emitting display as claimed in claim 6, wherein the second electrode of the capacitor is coupled to the sub power line through a contact hole.

* * * * *